US012074029B2

(12) United States Patent
Van Cleemput et al.

(10) Patent No.: US 12,074,029 B2
(45) Date of Patent: Aug. 27, 2024

(54) MOLYBDENUM DEPOSITION

(71) Applicant: Lam Research Corporation, Fremont, CA (US)

(72) Inventors: Patrick A. Van Cleemput, Duvall, WA (US); Shruti Vivek Thombare, Sunnyvale, CA (US); Michal Danek, Cupertino, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 17/814,209

(22) Filed: Jul. 21, 2022

(65) Prior Publication Data

US 2022/0359211 A1 Nov. 10, 2022

Related U.S. Application Data

(63) Continuation of application No. 17/294,378, filed as application No. PCT/US2019/062067 on Nov. 18, 2019.

(Continued)

(51) Int. Cl.
*H01L 21/285* (2006.01)
*C23C 16/06* (2006.01)
(Continued)

(52) U.S. Cl.
CPC ........ *H01L 21/28568* (2013.01); *C23C 16/06* (2013.01); *C23C 16/45525* (2013.01);
(Continued)

(58) Field of Classification Search
CPC ........ H01L 21/28568; H01L 23/53257; H01L 21/28556; H01L 21/76864;
(Continued)

(56) References Cited

U.S. PATENT DOCUMENTS 1,012,671 A 12/1911 Long
5,502,005 A 3/1996 Mikagi
(Continued)

FOREIGN PATENT DOCUMENTS

CN 1332267 A 1/2002
CN 1957446 A 5/2007
(Continued)

OTHER PUBLICATIONS

Anonymous, "Lam Research enables next-generation memory with industry's first ALD process for low-fluorine tungsten fill" Semiconductor Digest News and Industry Trends for Solid State Technology, Aug. 2016, 2 Pages.
(Continued)

*Primary Examiner* — Caleb E Henry
(74) *Attorney, Agent, or Firm* — Weaver Austin Villeneuve & Sampson LLP

(57) ABSTRACT

Provided herein are low resistance metallization stack structures for logic and memory applications and related methods of fabrication. The methods involve forming bulk conductive films on thin low resistivity transition metal layers that have large grain size. The bulk conductive films follow the grains of the low resistivity transition metal films, resulting in large grain size. Also provided are devices including template layers and bulk films.

11 Claims, 8 Drawing Sheets

Related U.S. Application Data

(60) Provisional application No. 62/769,479, filed on Nov. 19, 2018.

(51) Int. Cl.
   *C23C 16/455* (2006.01)
   *H01L 23/532* (2006.01)
   *H10B 12/00* (2023.01)
   *H10B 41/27* (2023.01)
   *H10B 43/27* (2023.01)

(52) U.S. Cl.
   CPC ........ *H01L 23/53257* (2013.01); *H10B 12/34* (2023.02); *H10B 41/27* (2023.02); *H10B 43/27* (2023.02)

(58) Field of Classification Search
   CPC ......... H01L 21/76876; H01L 23/53266; H01L 21/6838; H01L 2924/01074; H01L 21/28194; H01L 21/324; H01L 2924/01042; H01L 21/0228; H01L 21/6864; H01L 21/6876; H01L 27/11582; H01L 27/1156; C23C 16/06; C23C 16/45525; H10B 12/34; H10B 41/27; H10B 43/27; H10B 12/488; H01B 41/20; H01B 41/35; H01B 12/488; H01B 41/27
   See application file for complete search history.

(56) References Cited

U.S. PATENT DOCUMENTS

| | | |
|---|---|---|
| 5,643,394 A | 7/1997 | Maydan et al. |
| 5,688,331 A | 11/1997 | Aruga et al. |
| 6,035,101 A | 3/2000 | Sajoto et al. |
| 6,103,609 A | 8/2000 | Lee et al. |
| 6,271,084 B1 * | 8/2001 | Tu .................... H01L 28/60 |
| | | 257/E21.59 |
| 6,284,653 B1 | 9/2001 | Tseng |
| 6,306,216 B1 | 10/2001 | Kim et al. |
| 6,359,160 B1 | 3/2002 | Sun et al. |
| 6,635,965 B1 | 10/2003 | Lee et al. |
| 6,794,287 B2 | 9/2004 | Saanila et al. |
| 6,844,258 B1 | 1/2005 | Fair et al. |
| 6,958,174 B1 | 10/2005 | Klaus et al. |
| 7,005,372 B2 | 2/2006 | Levy et al. |
| 7,141,494 B2 | 11/2006 | Lee et al. |
| 7,250,367 B2 | 7/2007 | Vaartstra et al. |
| 7,262,125 B2 | 8/2007 | Wongsenakhum et al. |
| 7,560,581 B2 | 7/2009 | Gordon et al. |
| 7,589,017 B2 | 9/2009 | Chan et al. |
| 7,691,749 B2 | 4/2010 | Levy et al. |
| 7,772,114 B2 | 8/2010 | Chan et al. |
| 7,955,972 B2 | 6/2011 | Chan et al. |
| 8,053,365 B2 | 11/2011 | Humayun et al. |
| 8,058,170 B2 | 11/2011 | Chandrashekar et al. |
| 8,089,128 B2 | 1/2012 | Ramaswamy et al. |
| 8,101,521 B1 * | 1/2012 | Gao .................... C23C 16/0281 |
| | | 438/677 |
| 8,278,216 B1 | 10/2012 | Alers et al. |
| 9,082,826 B2 | 7/2015 | Chandrashekar et al. |
| 9,159,571 B2 * | 10/2015 | Humayun ......... H01L 21/28562 |
| 9,175,023 B2 | 11/2015 | Odedra et al. |
| 9,236,297 B2 | 1/2016 | Chen et al. |
| 9,548,266 B2 * | 1/2017 | Ajuria .................... H01L 24/02 |
| 9,583,385 B2 * | 2/2017 | Lee .................... H01L 21/28562 |
| 9,595,470 B2 | 3/2017 | Bamnolker et al. |
| 9,613,818 B2 * | 4/2017 | Ba .................... H01L 21/28562 |
| 9,653,353 B2 | 5/2017 | Chandrashekar et al. |
| 9,659,998 B1 * | 5/2017 | Lung .................... H10N 70/021 |
| 9,899,372 B1 * | 2/2018 | Bi .................... H01L 28/82 |
| 9,978,605 B2 | 5/2018 | Bamnolker et al. |
| 10,079,144 B2 | 9/2018 | Kim et al. |
| 10,094,021 B2 | 10/2018 | Lansalot-Matras et al. |
| 10,121,671 B2 | 11/2018 | Fu et al. |
| 10,283,404 B2 | 5/2019 | Na et al. |
| 10,395,984 B2 * | 8/2019 | Backes .................... H01L 23/528 |
| 10,505,111 B1 * | 12/2019 | Ok .................... H01L 21/7682 |
| 10,510,590 B2 * | 12/2019 | Thombare ......... H01L 21/76843 |
| 10,510,951 B1 * | 12/2019 | Yu .................... H10N 70/801 |
| 10,573,522 B2 | 2/2020 | Jandl et al. |
| 10,731,250 B2 | 8/2020 | Kim et al. |
| 10,777,453 B2 * | 9/2020 | Thombare ......... H01L 21/28568 |
| 10,995,405 B2 | 5/2021 | Dezelah et al. |
| 11,355,345 B2 | 6/2022 | Jandl et al. |
| 11,549,175 B2 | 1/2023 | Butail et al. |
| 11,821,071 B2 | 11/2023 | Blakeney |
| 2001/0002326 A1 | 5/2001 | Yang et al. |
| 2002/0009872 A1 | 1/2002 | Hoshino et al. |
| 2002/0024140 A1 | 2/2002 | Nakajima et al. |
| 2002/0045355 A1 | 4/2002 | Chong et al. |
| 2003/0019428 A1 | 1/2003 | Ku et al. |
| 2003/0082296 A1 | 5/2003 | Elers et al. |
| 2003/0194825 A1 | 10/2003 | Law et al. |
| 2003/0209193 A1 | 11/2003 | Van Wijck |
| 2004/0083977 A1 | 5/2004 | Brown et al. |
| 2004/0202786 A1 | 10/2004 | Wongsenakhum et al. |
| 2005/0031786 A1 | 2/2005 | Lee et al. |
| 2005/0186342 A1 | 8/2005 | Sager et al. |
| 2005/0212139 A1 | 9/2005 | Leinikka et al. |
| 2005/0277296 A1 | 12/2005 | Adetutu et al. |
| 2005/0282384 A1 | 12/2005 | Nawafune et al. |
| 2006/0040052 A1 | 2/2006 | Fang et al. |
| 2006/0046521 A1 | 3/2006 | Vaartstra et al. |
| 2006/0102950 A1 | 5/2006 | Takebuchi et al. |
| 2006/0115590 A1 | 6/2006 | Suzuki et al. |
| 2007/0009658 A1 | 1/2007 | Yoo et al. |
| 2007/0066060 A1 | 3/2007 | Wang |
| 2007/0077712 A1 | 4/2007 | Joo et al. |
| 2007/0215852 A1 * | 9/2007 | Lung .................... H10N 70/8413 |
| | | 257/4 |
| 2007/0232015 A1 * | 10/2007 | Liu .................... H10N 70/011 |
| | | 257/E21.589 |
| 2008/0014352 A1 | 1/2008 | Xi et al. |
| 2008/0061282 A1 * | 3/2008 | Sato .................... H10N 70/011 |
| | | 438/102 |
| 2008/0116437 A1 * | 5/2008 | Oh .................... H10N 70/8828 |
| | | 257/E47.001 |
| 2008/0124926 A1 | 5/2008 | Chan et al. |
| 2008/0197335 A1 * | 8/2008 | Yu .................... H10N 70/8265 |
| | | 438/102 |
| 2008/0206987 A1 | 8/2008 | Gelatos et al. |
| 2008/0227291 A1 | 9/2008 | Lai et al. |
| 2008/0254623 A1 | 10/2008 | Chan et al. |
| 2008/0268642 A1 | 10/2008 | Yanagita et al. |
| 2008/0280390 A1 * | 11/2008 | Kim .................... H10B 63/30 |
| | | 438/95 |
| 2008/0303014 A1 * | 12/2008 | Goux .................... H10N 70/043 |
| | | 438/102 |
| 2008/0317972 A1 | 12/2008 | Hendriks et al. |
| 2009/0004848 A1 | 1/2009 | Kim et al. |
| 2009/0053893 A1 | 2/2009 | Khandelwal et al. |
| 2009/0081374 A1 | 3/2009 | Yang et al. |
| 2009/0120464 A1 | 5/2009 | Rasheed et al. |
| 2009/0149022 A1 | 6/2009 | Chan et al. |
| 2009/0212280 A1 | 8/2009 | Werner et al. |
| 2009/0239368 A1 | 9/2009 | Park et al. |
| 2009/0304914 A1 | 12/2009 | Nalla et al. |
| 2010/0107927 A1 | 5/2010 | Stewart et al. |
| 2010/0159694 A1 * | 6/2010 | Chandrashekar ........................... |
| | | H01L 21/76877 |
| | | 257/E21.17 |
| 2010/0167527 A1 | 7/2010 | Wu et al. |
| 2010/0207245 A1 | 8/2010 | Cheng et al. |
| 2010/0213541 A1 | 8/2010 | Jeon et al. |
| 2010/0320607 A1 | 12/2010 | Suzuki |
| 2011/0020546 A1 | 1/2011 | Hamalainen et al. |
| 2011/0021024 A1 | 1/2011 | Calvo-Munoz et al. |
| 2011/0146568 A1 | 6/2011 | Haukka et al. |
| 2011/0151615 A1 | 6/2011 | Gordon et al. |
| 2011/0155993 A1 * | 6/2011 | Chen .................... H10N 70/8828 |
| | | 438/102 |

(56) References Cited

U.S. PATENT DOCUMENTS

| | | |
|---|---|---|
| 2011/0223763 A1* | 9/2011 | Chan ............... C23C 16/45525 |
| | | 438/654 |
| 2011/0256645 A1 | 10/2011 | Tam et al. |
| 2011/0287184 A1 | 11/2011 | Shenai-Khatkhate et al. |
| 2012/0045589 A1 | 2/2012 | Ivanov et al. |
| 2012/0119177 A1* | 5/2012 | Erbetta ............... H10N 70/8828 |
| | | 257/E21.52 |
| 2012/0187305 A1 | 7/2012 | Elam et al. |
| 2012/0231626 A1 | 9/2012 | Lee et al. |
| 2012/0305872 A1* | 12/2012 | Yoon ................... H10N 70/882 |
| | | 257/532 |
| 2013/0109172 A1 | 5/2013 | Collins et al. |
| 2013/0164928 A1 | 6/2013 | Lim et al. |
| 2013/0189837 A1 | 7/2013 | Haukka et al. |
| 2013/0302980 A1 | 11/2013 | Chandrashekar et al. |
| 2013/0333621 A1 | 12/2013 | Ronsse et al. |
| 2014/0106083 A1 | 4/2014 | Wu et al. |
| 2014/0138604 A1* | 5/2014 | Liu ..................... H10N 70/231 |
| | | 257/4 |
| 2014/0147589 A1 | 5/2014 | Khandelwal et al. |
| 2014/0217590 A1 | 8/2014 | Nalla et al. |
| 2015/0179461 A1 | 6/2015 | Bamnolker et al. |
| 2015/0262939 A1 | 9/2015 | Sakata |
| 2015/0325475 A1 | 11/2015 | Bamnolker et al. |
| 2015/0348840 A1 | 12/2015 | Bamnolker et al. |
| 2015/0354064 A1* | 12/2015 | Kolics ................... C23C 18/52 |
| | | 438/678 |
| 2016/0027614 A1 | 1/2016 | Manna et al. |
| 2016/0040289 A1 | 2/2016 | Gatineau et al. |
| 2016/0056074 A1 | 2/2016 | Na et al. |
| 2016/0064409 A1 | 3/2016 | Yaegashi |
| 2016/0077435 A1 | 3/2016 | Ban et al. |
| 2016/0104624 A1 | 4/2016 | Fu et al. |
| 2016/0109800 A1 | 4/2016 | Bae et al. |
| 2016/0118345 A1 | 4/2016 | Chen et al. |
| 2016/0168699 A1 | 6/2016 | Fukazawa et al. |
| 2016/0172211 A1 | 6/2016 | Demos et al. |
| 2016/0181272 A1 | 6/2016 | Rabkin et al. |
| 2016/0225632 A1 | 8/2016 | Shaikh et al. |
| 2016/0300952 A1 | 10/2016 | Toriumi et al. |
| 2016/0309596 A1 | 10/2016 | Shaviv et al. |
| 2016/0343612 A1* | 11/2016 | Wang ................. H01L 21/76856 |
| 2016/0351401 A1 | 12/2016 | Ba et al. |
| 2016/0351444 A1* | 12/2016 | Schloss ............ H01L 21/28562 |
| 2017/0040214 A1 | 2/2017 | Lai et al. |
| 2017/0062224 A1* | 3/2017 | Fu ........................... C23C 16/06 |
| 2017/0062714 A1* | 3/2017 | Kau .................... H10N 70/8616 |
| 2017/0069527 A1* | 3/2017 | Haukka ............. H01L 21/76864 |
| 2017/0117155 A1 | 4/2017 | Bamnolker et al. |
| 2017/0125548 A1 | 5/2017 | Hung et al. |
| 2017/0229341 A1 | 8/2017 | Chang et al. |
| 2017/0268107 A1 | 9/2017 | Lansalot-Matras et al. |
| 2017/0294381 A1 | 10/2017 | Briggs et al. |
| 2017/0306479 A1 | 10/2017 | Raisanen et al. |
| 2017/0306490 A1 | 10/2017 | Chan et al. |
| 2017/0350008 A1 | 12/2017 | Collins et al. |
| 2017/0358482 A1 | 12/2017 | Chen et al. |
| 2018/0019165 A1 | 1/2018 | Baum et al. |
| 2018/0053660 A1 | 2/2018 | Jandl et al. |
| 2018/0142345 A1 | 5/2018 | Meng et al. |
| 2018/0151497 A1 | 5/2018 | Makala et al. |
| 2018/0166276 A1 | 6/2018 | Nakao et al. |
| 2018/0240675 A1 | 8/2018 | Bamnolker et al. |
| 2018/0240676 A1 | 8/2018 | Chan et al. |
| 2018/0247832 A1 | 8/2018 | Fischer et al. |
| 2018/0261503 A1* | 9/2018 | Meng ................. H01L 21/76876 |
| 2018/0286668 A1 | 10/2018 | Baum et al. |
| 2018/0294187 A1* | 10/2018 | Thombare ......... H01L 21/76879 |
| 2018/0342390 A1* | 11/2018 | Xiao ................. H01L 21/02277 |
| 2018/0355484 A1 | 12/2018 | Lansalot-Matras et al. |
| 2019/0003050 A1 | 1/2019 | Dezelah et al. |
| 2019/0006226 A1 | 1/2019 | Khare et al. |
| 2019/0019725 A1 | 1/2019 | Chandrashekar et al. |
| 2019/0067003 A1 | 2/2019 | Zope et al. |
| 2019/0067014 A1 | 2/2019 | Shrestha et al. |
| 2019/0067094 A1 | 2/2019 | Zope et al. |
| 2019/0088474 A1* | 3/2019 | MacDonald ............... C07F 7/10 |
| 2019/0088555 A1 | 3/2019 | Xie et al. |
| 2019/0157102 A1 | 5/2019 | Jian et al. |
| 2019/0157141 A1 | 5/2019 | Liao et al. |
| 2019/0161853 A1 | 5/2019 | Aoyama et al. |
| 2019/0177838 A1 | 6/2019 | Cadot et al. |
| 2019/0189456 A1 | 6/2019 | Mullick et al. |
| 2019/0189688 A1* | 6/2019 | Lille .................... H10N 70/826 |
| 2019/0226086 A1 | 7/2019 | Wright, Jr. et al. |
| 2019/0256467 A1 | 8/2019 | Anthis et al. |
| 2019/0273019 A1 | 9/2019 | Mullick et al. |
| 2019/0304771 A1 | 10/2019 | Isobe |
| 2019/0338419 A1 | 11/2019 | L'Heureux |
| 2019/0368039 A1 | 12/2019 | Arteaga et al. |
| 2019/0371662 A1 | 12/2019 | Chen et al. |
| 2020/0006073 A1 | 1/2020 | Smith et al. |
| 2020/0010954 A1* | 1/2020 | Bhuyan ................. C23C 16/401 |
| 2020/0075403 A1 | 3/2020 | Thombare et al. |
| 2020/0105515 A1 | 4/2020 | Maes et al. |
| 2020/0111675 A1 | 4/2020 | Takatsuki et al. |
| 2020/0144066 A1 | 5/2020 | Jandl et al. |
| 2020/0152870 A1* | 5/2020 | Lin ...................... H10N 70/023 |
| 2020/0194670 A1* | 6/2020 | Allegra ................ H10N 70/841 |
| 2020/0219933 A1* | 7/2020 | Cheng ................. H10N 70/841 |
| 2020/0227275 A1 | 7/2020 | Mullick et al. |
| 2020/0332416 A1 | 10/2020 | Fluit |
| 2020/0343136 A1 | 10/2020 | Yu et al. |
| 2020/0365456 A1 | 11/2020 | Thombare et al. |
| 2020/0402846 A1 | 12/2020 | Collins et al. |
| 2021/0047726 A1 | 2/2021 | Liu et al. |
| 2021/0057223 A1 | 2/2021 | Stevens et al. |
| 2021/0082750 A1 | 3/2021 | Yu et al. |
| 2021/0098532 A1* | 4/2021 | Wu ...................... H10N 70/826 |
| 2021/0140043 A1 | 5/2021 | Thombare et al. |
| 2021/0238736 A1 | 8/2021 | Butail et al. |
| 2021/0277517 A1 | 9/2021 | Liu et al. |
| 2021/0285102 A1 | 9/2021 | Yoon et al. |
| 2021/0320034 A1 | 10/2021 | Lei et al. |
| 2021/0348271 A1 | 11/2021 | Mishra et al. |
| 2021/0407809 A1 | 12/2021 | Zope et al. |
| 2022/0013365 A1 | 1/2022 | Van Cleemput et al. |
| 2022/0018017 A1 | 1/2022 | Kim et al. |
| 2022/0037163 A1 | 2/2022 | Yang et al. |
| 2022/0044929 A1* | 2/2022 | Xiao .................. H01L 21/02222 |
| 2022/0139713 A1 | 5/2022 | Färm et al. |
| 2022/0170155 A1 | 6/2022 | Blakeney |
| 2022/0195598 A1 | 6/2022 | Collins et al. |
| 2022/0220136 A1 | 7/2022 | Leoncini et al. |
| 2022/0220139 A1 | 7/2022 | Leoncini et al. |
| 2022/0220607 A1 | 7/2022 | Leoncini et al. |
| 2022/0223471 A1 | 7/2022 | Thombare et al. |
| 2022/0262640 A1 | 8/2022 | Jandl et al. |
| 2022/0285211 A1 | 9/2022 | Färm et al. |
| 2022/0298624 A1 | 9/2022 | Blakeney et al. |
| 2022/0328317 A1 | 10/2022 | Na et al. |
| 2022/0356579 A1 | 11/2022 | Collins et al. |
| 2022/0375792 A1 | 11/2022 | Schloss et al. |
| 2022/0389579 A1 | 12/2022 | Thombare et al. |
| 2023/0290680 A1 | 9/2023 | Collins et al. |
| 2023/0326790 A1 | 10/2023 | Tarafdar et al. |
| 2024/0052486 A1 | 2/2024 | Blakeney |
| 2024/0136192 A1 | 4/2024 | Schloss et al. |

FOREIGN PATENT DOCUMENTS

| | | |
|---|---|---|
| CN | 102206387 A | 10/2011 |
| CN | 102206387 B | 4/2014 |
| CN | 104752339 A | 7/2015 |
| CN | 105097446 A | 11/2015 |
| CN | 106575626 A | 4/2017 |
| CN | 107710443 A | 2/2018 |
| CN | 109072424 A | 12/2018 |
| CN | 109661481 A | 4/2019 |
| EP | 0855735 A2 | 7/1998 |
| EP | 1728894 A1 | 12/2006 |
| JP | H02231714 A | 9/1990 |
| JP | H11343571 A | 12/1999 |

(56) References Cited

FOREIGN PATENT DOCUMENTS

| | | |
|---|---|---|
| JP | 2001172049 A | 6/2001 |
| JP | 2001274105 A | 10/2001 |
| JP | 2001284360 A | 10/2001 |
| JP | 2005150416 A | 6/2005 |
| JP | 2008205219 A | 9/2008 |
| JP | 2008211183 A | 9/2008 |
| JP | 2011035366 A | 2/2011 |
| JP | 2012246531 A | 12/2012 |
| JP | 2014074190 A | 4/2014 |
| JP | 2016098406 A | 5/2016 |
| JP | 2016516892 A | 6/2016 |
| JP | 2017053024 A | 3/2017 |
| JP | 2019044266 A | 3/2019 |
| JP | 2020513065 A | 4/2020 |
| KR | 20030043201 A | 6/2003 |
| KR | 100477840 B1 | 6/2005 |
| KR | 20050054122 A | 6/2005 |
| KR | 20100096488 A | 9/2010 |
| KR | 20110024932 A | 3/2011 |
| KR | 20150063562 A | 6/2015 |
| KR | 20150108780 A | 9/2015 |
| KR | 20160098986 A | 8/2016 |
| KR | 101745074 B1 | 6/2017 |
| KR | 20170095801 A | 8/2017 |
| KR | 20190024834 A | 3/2019 |
| KR | 20190130046 A | 11/2019 |
| KR | 20200056543 A | 5/2020 |
| KR | 20200090108 A | 7/2020 |
| KR | 20210099232 A | 8/2021 |
| KR | 20210156444 A | 12/2021 |
| TW | 201123305 A | 7/2011 |
| TW | 201542857 A | 11/2015 |
| TW | 201705490 A | 2/2017 |
| TW | 201710543 A | 3/2017 |
| TW | 201738405 A | 11/2017 |
| TW | 201741325 A | 12/2017 |
| TW | 201812069 A | 4/2018 |
| TW | 201812070 A | 4/2018 |
| TW | 201907037 A | 2/2019 |
| WO | WO-2006036865 A2 | 4/2006 |
| WO | WO-2012047591 A1 | 4/2012 |
| WO | WO-2014052642 A1 | 4/2014 |
| WO | WO-2015023404 A1 | 2/2015 |
| WO | WO-2016191432 A1 | 12/2016 |
| WO | WO-2017091571 A1 | 6/2017 |
| WO | WO-2018191183 A1 | 10/2018 |
| WO | WO-2019099233 A1 | 5/2019 |
| WO | WO-2020023790 A1 | 1/2020 |
| WO | WO-2020028587 A1 | 2/2020 |
| WO | WO-2020185618 A1 | 9/2020 |
| WO | WO-2021035236 A1 | 2/2021 |
| WO | WO-2021046058 A1 | 3/2021 |
| WO | WO-2021076636 A1 | 4/2021 |
| WO | WO-2021178399 A1 | 9/2021 |
| WO | WO-2021237032 A1 | 11/2021 |
| WO | WO-2022108762 A1 | 5/2022 |
| WO | WO-2022150270 A1 | 7/2022 |
| WO | WO-2022221210 A1 | 10/2022 |

OTHER PUBLICATIONS

Chinese First Office Action dated Jan. 4, 2021 issued in Application No. CN 201710700258.6.
Chinese Second Office Action dated Jun. 17, 2021 issued in Application No. CN 201710700258.6.
Chiu, H. et al., "Deposition of Molybdenum Carbonitride Thin Films from Mo(NBu$^t$)$_2$(NHBu$^t$)$_2$", J. Mater. Res, Jul. 1994, vol. 9, No. 7, pp. 1622-1624.
Co-pending U.S. Appl. No. 17/763,529, filed Mar. 24, 2022.
Final Office Action dated May 23, 2019 issued in U.S. Appl. No. 15/948,143.
Final Office Action dated Sep. 2, 2021 issued in U.S. Appl. No. 16/947,286.
International Preliminary Report on Patentability dated Mar. 10, 2022, in Application No. PCT/US2020/070434.
International Preliminary Report on Patentability dated Mar. 3, 2022, in Application No. PCT/US2020/070390.
International Search Report and Written Opinion dated Feb. 3, 2021, in Application No. PCT/US2020/055596.
International Search Report and Written Opinion dated Jun. 9, 2022 in International Application No. PCT/US2022/017005.
International Preliminary Report on Patentability dated Apr. 28, 2022, in PCT Application No. PCT/US2020/055596.
International Preliminary Report on Patentability dated Aug. 12, 2021, issued in Application No. PCT/US2020/015241.
International Preliminary Report on Patentability dated Feb. 4, 2021 in Application No. PCT/US2019/043514.
International Preliminary Report on Patentability dated Jun. 3, 2021 in Application No. PCT/US2019/062067.
International Preliminary Report on Patentability dated Jun. 4, 2020 in Application No. PCT/US2018/061803.
International Preliminary Report on Patentability dated Mar. 17, 2022 in PCT Application No. PCT/US2020/048951.
International Preliminary Report on Patentability dated Nov. 12, 2020 in Application No. PCT/US2019/030712.
International Preliminary Report on Patentability dated Oct. 24, 2019 in Application No. PCT/US2018/026746.
International Preliminary Report on Patentability dated Sep. 23, 2021 issued in Application No. PCT/US2020/021543.
International Search Report and Written Opinion dated Aug. 19, 2019 in Application No. PCT/US2019/030712.
International Search Report and Written Opinion dated Dec. 4, 2020, in PCT Application No. PCT/US2020/048951.
International Search Report and Written Opinion dated Feb. 4, 2021, in PCT Application No. PCT/US2020/070390.
International Search Report and Written Opinion dated Jul. 1, 2020 in Application No. PCT/US2020/021543.
International Search Report and Written Opinion dated Jul. 27, 2018 in Application No. PCT/US2018/026746.
International Search Report and Written Opinion dated Jun. 3, 2020, issued in Application No. PCT/US2020/015241.
International Search Report and Written Opinion dated Mar. 8, 2019 in Application No. PCT/US2018/061803.
International Search Report and Written Opinion dated Mar. 9, 2020 in Application No. PCT/US2019/062067.
International Search Report and Written Opinion dated Nov. 11, 2019 in Application No. PCT/US2019/043514.
International Search Report and Written Opinion dated Nov. 11, 2020 issued in Application No. PCT/US2020/070434.
Jamie, W. et al., "In Situ Atomic Layer Deposition and Electron Tunneling Characterization of Monolayer Al$_2$O$_3$ on Fe for Magnetic Tunnel Junctions", AIP Advances, 2018, vol. 8, No. 125218, pp. 1-9.
Johnson, R.W., Hultqvist, A., Bent, S.F., "A brief review of atomic layer deposition: from fundamentals to applications", Materials today, (Jun. 1, 2014), 17(5):236-46.
JP Office Action dated Apr. 19, 2022 in Application No. JP20200504286 with English translation.
Kim, K. et al., "Simulation of Residual Stress and its Impact on a Poly-Silicon Channel for Three-Dimensional, Stacked, Vertical-NAND Flash Memories", Journal of the Korean Physical Society, 2017, vol. 70 (12), pp. 1041-1048.
KR Office Action dated Feb. 21, 2022, in Application No. KR10-2017-0102113 with English Translation.
KR Office Action dated May 30, 2022, in Application No. KR10-2019-7033130 With English Translation.
Kurek, A. et al., "Recent Advances Using Guanidinate Ligands for Chemical Vapour Deposition (CVD) and Atomic Layer Deposition (ALD) Applications," Australian Journal of Chemistry, Jun. 2014, vol. 67, pp. 989-996.
Li, Z. et al., "Atomic Layer Deposition of Ultrathin Copper Metal Films from a Liquid Copper(I) Amidinate Precursor", Journal of the Electrochemical Society, 2006, vol. 153, No. 11, pp. C787-C794.
Lim, B. et al., "Atomic Layer Deposition of Transition Metals", Nature Materials, 2003, vol. 2, pp. 749-754.

(56) References Cited

OTHER PUBLICATIONS

Lin, S. et al., "Effect of Nitrogen on the Physical Properties and work Function of $MoN_x$ Cap Layers on $HfO_2$ Gate Dielectrics", ECS Journal of Solid State Science and Technology, 2014, vol. 3, No. 12, pp. N161-N165.
Majumder et al. "Investigation on the diffusion barrier properties of sputtered Mo/W-N thin films in Cu interconnects," Applied Physics Letters, vol. 91 (2007), pp. 162108-1-162108-3.
Miikkulainen, V. et al., "Atomic Layer Deposition of Molybdenum Nitride from Bis(tert-butylimido)-bis(dimethylamido)molybdenum and Ammonia onto Several Types of Substrate Materials with Equal Growth per Cycle", Chemistry of Materials, 2007, vol. 19, pp. 263-269.
Miikkulainen, V. et al., "Bis(tert-butylimido)-bis(dialkylamido) Complexes of Molybdenum as Atomic Layer Deposition (ALD) Precursors for Molybdenum Nitride: the Effect of the Alkyl Group", Chemical Vapor Deposition, 2008, vol. 14, pp. 71-77.
Mohimi, E, et al., "Low temperature chemical vapor deposition of superconducting molybdenum carbonitride thin films", Journal of Vacuum Science & Technology A , 2019, vol. 37, No. 2, 021503, 6 pages.
Nandi, D.K. et al., "Atomic Layer Deposited Molybdenum Nitride Thin Film: A Promising Anode Material for Li Ion Batteries", ACS Applied Material Interfaces, 2014, vol. 6, pp. 6606-6615.
Notice of Allowance dated Apr. 27, 2020 issued in U.S. Appl. No. 16/676,169.
Notice of Allowance dated Aug. 6, 2019 issued in U.S. Appl. No. 15/948,143.
Office Action dated Apr. 27, 2021 issued in U.S. Appl. No. 16/947,286.
Office Action dated Aug. 12, 2021 issued in U.S. Appl. No. 16/764,812.
Office Action dated Feb. 4, 2019 issued in U.S. Appl. No. 15/948,143.
Office Action Requirement for Restriction/Election dated Sep. 22, 2021 issued in U.S. Appl. No. 17/250,452.
Otsuka, S. et al., "A Novel Molybdenum Thiolato Compound, Tetrakis(tert-butylthiolato)molybdenum(IV). Preparation and Crystal and Molecular Structure" Journal of American chemistry society, 1981, vol. 103, pp. 3011-3014.
Ranade, P. et al., "Work Function Engineering of Molybdenum Gate Electrodes by Nitrogen Implantation", Electrochemical and Solid-State Letters, 2001, vol. 4, No. 11, pp. G85-G87.
Shimizu, H. et al., "Precursor-based designs of nano-structures and their processing for Co(W) alloy films as a single layered barrier/liner layer in future Cu-interconnect", Journal of Materials Chemistry C, 2015, vol. 3, pp. 2500-2510.
Specification of U.S. Appl. No. 62/425,704 (Electronically Filed on Nov. 23, 2016).
TW Office Action dated May 24, 2022, in Application No. TW20180112210 with English translation.
TW Office Action dated Oct. 18, 2021, in application No. TW107112210 with English translation.
U.S. Advisory Action dated May 3, 2022 in U.S. Appl. No. 16/764,812.
U.S. Corrected Notice of Allowance dated Feb. 16, 2022, in U.S. Appl. No. 16/724,231.
U.S. Corrected Notice of Allowance dated May 11, 2022, in U.S. Appl. No. 16/724,231.
U.S. Final office Action dated Jul. 25, 2022 in U.S. Appl. No. 17/250,452.
U.S. Final Office Action dated Jan. 31, 2022 in U.S. Appl. No. 16/764,812.
U.S. Final Office Action dated Mar. 29, 2021 issued in U.S. Appl. No. 16/724,231.
U.S. Non Final Office Action dated Mar. 21, 2022, in U.S. Appl. No. 17/250,452.
U.S. Non-Final Office Action dated Dec. 15, 2021 in U.S. Appl. No. 17/250,014.
U.S. Non-Final Office Action dated Jun. 24, 2022, in U.S. Appl. No. 17/436,944.
U.S. Non-Final Office Action dated May 16, 2022 in U.S. Appl. No. 16/764,812.
U.S. Non-Final Office Action dated Nov. 19, 2021, in U.S. Appl. No. 17/250,452.
U.S. Notice of Allowance dated Feb. 2, 2022 in U.S. Appl. No. 16/724,231.
U.S. Notice of Allowance dated Jun. 7, 2022 in U.S. Appl. No. 17/250,014.
U.S. Notice of allowance dated Sep. 29, 2021 issued in U.S. Appl. No. 16/724,231.
U.S. Office Action dated Sep. 22, 2020 issued in U.S. Appl. No. 16/724,231.
U.S. Office Action Restriction/Election dated Sep. 9, 2021 issued in U.S. Appl. No. 17/250,014.
U.S. Appl. No. 17/639,846, inventors Na Jeong-Seok et al., filed Mar. 2, 2022.
U.S. Appl. No. 17/753,042, filed Feb. 16, 2022.
U.S. Appl. No. 17/814,206, inventors Collins et al., filed Jul. 21, 2022.
U.S. Appl. No. 17/814,207, inventors Thombare et al., filed Jul. 21, 2022.
Barry, S.T., "Amidinates, Guanidinates and Iminopyrrolidinates: Understanding Precursor Thermolysis to Design a Better Ligand," Coordination Chemistry Reviews, Dec. 2013, vol. 257(23-24), pp. 3192-3201.
Barry, S.T., et al., "The Chemistry of Inorganic Precursors during the Chemical Deposition of Films on Solid Surfaces," Accounts of chemical research, 2018, vol. 51, pp. 800-809.
Becker, J., et al., "Diffusion Barrier Properties of Tungsten Nitride Films Grown by Atomic Layer Deposition From bis(tert-butylimido) bis(dimethylamido)tungsten and ammonia," Applied Physics Letters, 2003, vol. 82 (14), pp. 2239-2241.
CN Office Action dated Feb. 28, 2023 in Application No. 201880038116.0 with English translation.
CN Office Action dated Jan. 13, 2023 in CN Application No. CN201980049916.7 with English Translation.
CN Office Action dated Jan. 16, 2023 in Application No. CN202080020646.X with English translation.
CN Office Action dated Nov. 17, 2022, in Application No. CN202080011300.3 with English translation.
CN Office Action dated Sep. 24, 2023, in Application No. CN202080020646.X with English translation.
CN Office Action dated Sep. 28, 2023, in application No. CN201980049916.7 with English translation.
Colaianni, M.L., et al., "The Adsorption and Dissociation of Carbon Monoxide on Clean and Oxygen-Modified Mo(110) Surfaces," Journal of the American Chemical Society, 1992, vol. 114(10), pp. 3735-3743.
Cotton, F.A., "Strong Homonuclear Metal-Metal Bonds," Accounts of Chemical Research, 1969, vol. 2 (8), pp. 240-247.
Coventor Brochure "3D NAND: Challenges Beyond 96-Layer Memory Arrays", Oct. 12, 2018, pp. 1-4.
Dezelah IV, C.L., et al., "A Low Valent Metalorganic Precursor for the Growth of Tungsten Nitride Thin Films by Atomic Layer Deposition," Journal of Materials Chemistry, 2007, vol. 17, pp. 1109-1116.
Dezelah IV, C.L., et al., "Atomic Layer Deposition of Tungsten(III) Oxide Thin Films from W2(NMe2)6 and Water: Precursor-Based Control of Oxidation State in the Thin Film Material," Journal of the American Chemical Society, Aug. 2, 2006, vol. 128(30), pp. 9638-9639.
Dominique, S. et al., "An alternative to Tungsten in 3D-NAND technology", IEEE International Interconnect Technology Conference (IITC), 2021, pp. 1-3.
EP Partial Supplementary European Search report dated Sep. 13, 2023, in Application No. EP20854552.5.
International Preliminary Report on Patentability dated Dec. 1, 2022, in PCT Application No. PCT/US2021/033564.
International Search Report and Written Opinion dated Sep. 9, 2021 in Application No. PCT/US2021/033564.
International Preliminary Report on Patentability dated Jun. 1, 2023, in Application No. PCT/US2021/058099.

(56) References Cited

OTHER PUBLICATIONS

International Preliminary Report on Patentability dated Sep. 7, 2023, in PCT Application No. PCT/US2022/017005.
International Search Report and Written Opinion dated Apr. 7, 2023 in PCT Application No. PCT/US2022/080705.
International Search Report and Written Opinion dated Apr. 27, 2023 in PCT Application No. PCT/US2022/080863.
International Search Report and Written Opinion dated Aug. 2, 2022 in Application No. PCT/US2022/024295.
International Search Report and Written Opinion dated Aug. 11, 2023, in Application No. PCT/US2023/019795.
International Search Report and Written Opinion dated Aug. 16, 2023, in Application No. PCT/US2023/017635.
International Search Report and Written Opinion dated Aug. 16, 2023, in Application No. PCT/US2023/019800.
International Search Report and Written Opinion dated Aug. 16, 2023, in Application No. PCT/US2023/019000.
International Search Report and Written Opinion dated Jun. 19, 2023, in Application No. PCT/US2023/062877.
International Search Report and Written Opinion dated Mar. 3, 2022, in Application No. PCT/US2021/058099.
International Search Report and Written Opinion dated Sep. 6, 2023, in Application No. PCT/US2023/023023.
International Search Report and Written Opinion dated Sep. 7, 2022 in Application No. PCT/US2022/028845.
Ishihara, S., et al., "MOCVD of Monolayer MoS2 using Novel Molybdenum Precursor i-Pr2DADMo(CO)3," Materials Research Society, 2018, vol. 3, pp. 379-384.
Jang, Y., et al., "Highly-conformal Nanocrystalline Molybdenum Nitride Thin Films by Atomic Layer Deposition as a Diffusion Barrier Against Cu," Journal of Alloys and Compounds, 2016, vol. 663, pp. 651-658.
JP Office Action dated Jun. 6, 2023 in Application No. JP2020561743 With English translation.
JP Office Action dated Oct. 3, 2023 in Application No. JP2022-522581 with English Translation.
JP Office Action dated Oct. 3, 2023 in Application No. JP2023-95239 with English Translation.
JP Office Action dated Sep. 5, 2023, in Application No. JP2022-145721 with English translation.
Juppo, et al., "Deposition of Molybdenum Thin Films by an Alternate Supply of MoCl 5 and Zn," Journal of Vacuum Science and Technology A, vol. 16, Sep./Oct. 1998, doi:10.1116/1.581430, pp. 2845-2850.
Karunarathne, M.C., et al., "Synthesis, Structural Characterization, and Volatility Evaluation of Zirconium and Hafnium Amidate Complexes," Journal of Organometallic Chemistry, 2017, vol. 847, pp. 204-212.
Kerrigan, M.M., et al., "Low Temperature, Selective Atomic Layer Deposition of Cobalt Metal Films Using Bis(1,4-di-tert-butyl-1,3-diazadienyl)cobalt and Alkylamine Precursors," Chemistry of Materials, 2017, vol. 29(17), pp. 7458-7466.
Kerrigan, M.M., et al., "Low Temperature, Selective Atomic Layer Deposition of Nickel Metal Thin Films," ACS Applied Materials & Interfaces, 2018, vol. 10(16), pp. 14200-14208.
Kim, T., et al., "Thermal Chemistry of Cu(I)-Iminopyrrolidinate and Cu(I)-Guanidinate Atomic Layer Deposition (ALD) Precursors on Ni(110) Single-Crystal Surfaces," Chemistry of Materials, 2013, vol. 25, pp. 3630-3639.
Knisley, T.J., et al., "Volatility and High Thermal Stability in Mid to Late First Row Transition Metal Diazadienyl Complexes," Organometallics, 2011, vol. 30(18), pp. 5010-5017.
KR Office Action dated Jul. 28, 2023, in Application No. KR10-2023-0081299 with English Translation.
KR Office Action dated Oct. 27, 2022 in Application No. KR10-2022-7026373 with English translation.
KR Office Action dated Sep. 27, 2022, in Application No. KR10-2017-0102113 with English translation.
Lee, B. et al., "ALD Tungsten Solves Capacity Challenges in 3D NAND Device Manufacturing", Lam Brochure, Jan. 2019, pp. 1-4.
Makela, M., et al., "Thermal Atomic Layer Deposition of Continuous and Highly Conducting Gold Thin Films," Chemistry of Materials, 2017, vol. 29, pp. 6130-6136.
McCain, M.N. et al., "Aerosol-Assisted Chemical Vapor Deposition of Lubricating MoS2 Films. Ferrous Substrates and Titanium Film Doping", Chemistry of Materials, 2008, vol. 20, No. 16, pp. 5438-5443.
Muhtade, M., et al., "Time Influence on Thickness and Grains for Molybdenum Thin Film," 2017, e-ISSN: 2289-8131, vol. 9, No. 2-13.
Ouyang, T., et al., "A Surface Chemistry Route to Molybdenum Sulfide and Germanide Films Using the Single-Source Precursor Tetrakis(diethylaminodithiocarbomato)molybdate(IV)," The Journal of Physical Chemistry B, 2004, vol. 108(5), pp. 17537-17545.
Seghete, D et al., Molybdenum Atomic Layer Deposition Using MoF6 and Si2H6 as the Reactants, Chemistry of Materials, 2011, vol. 23 No. 7, pp. 1668-1678.
SG Office Action dated Sep. 19, 2023, in application No. SG11202202087P.
SG Search Report and Written Opinion dated Feb. 10, 2023 in Application No. SG11202109796Q.
Shirazi, M., et al., "Initial Stage of Atomic Layer Deposition of 2D-MoS2 on a SiOZ surface: a DFT study," Physical Chemistry Chemical Physics, 2018, vol. 20 (24), pp. 1-18.
Singapore Written Opinion dated Mar. 15, 2023 issued in Application No. SG11202108217U.
Stephenson T A., et al., "487. Molybdenum(II) Carboxylates," Journal of the Chemical Society, 1964, pp. 2538-2541.
TW Office Action dated Aug. 16, 2022, in Application No. TW107141042 with English translation.
TW Office Action dated Aug. 31, 2023, in Application No. TW109102778 with English translation.
TW Office Action dated Feb. 10, 2023 in Application No. TW107112210 with English translation.
TW Office Action dated Feb. 23, 2023 in Application No. TW108126326 with English translation.
TW Office Action dated Sep. 14, 2022, in Application No. TW107112210 with English translation.
U.S. Advisory Action dated Oct. 18, 2022, in U.S. Appl. No. 17/250,452.
U.S. Final Office Action dated Feb. 2, 2023 in U.S. Appl. No. 17/436,944.
U.S. Final office Action dated Jun. 26, 2023 in U.S. Appl. No. 17/589,416.
U.S. Final Office Action dated Mar. 1, 2023 in U.S. Appl. No. 17/250,452.
U.S. Final Office Action dated May 31, 2023, in U.S. Appl. No. 17/814,207.
U.S. Final Office Action dated Nov. 30, 2022 in U.S. Appl. No. 16/764,812.
U.S. Final office Action dated Sep. 14, 2023 in U.S. Appl. No. 17/662,220.
U.S. Non-Final Office Action dated Aug. 29, 2023, in U.S. Appl. No. 17/310,293.
U.S. Non-Final Office Action dated Feb. 2, 2023 in U.S. Appl. No. 17/589,416.
U.S. Non-Final Office Action dated Feb. 2, 2023 in U.S. Appl. No. 17/662,220.
U.S. Non-Final Office Action dated Jun. 20, 2023, in U.S. Appl. No. 17/250,452.
U.S. Non-Final Office Action dated Nov. 30, 2022 in U.S. Appl. No. 17/814,207.
U.S. Notice of Allowance dated Aug. 3, 2023, in U.S. Appl. No. 17/436,944.
U.S. Notice of Allowance dated Jul. 14, 2023, in U.S. Appl. No. 17/436,944.
U.S. Notice of Allowance dated Oct. 4, 2023, in U.S. Appl. No. 17/436,944.
U.S. Notice of Allowance dated Sep. 16, 2022 in U.S. Appl. No. 17/250,014.
U.S. Appl. No. 18/253,038, inventors Lai C.S, et al., filed May 16, 2023.

(56) References Cited

OTHER PUBLICATIONS

U.S. Appl. No. 18/286,994, inventors Thombare S V, et al., filed Oct. 13, 2023.
U.S. Appl. No. 18/379,397, inventors Blakeney K J, et al., filed Oct. 12, 2023.
U.S. Appl. No. 62/362,582, inventors Meng et al., filed Jul. 14, 2016.
U.S. Supplemental Notice of Allowance dated Dec. 14, 2022 in U.S. Appl. No. 17/250,014.
Zhao, Y., et al., "Synthesis and Structures of Mono- and Dinuclear Molybdenum Complexes with Reduced α-Diimine Ligands," European Journal of Inorganic Chemistry, 2016, pp. 5411-5417.
JP Office Action dated Dec. 12, 2023 in JP Application No. 2021-527153 with English Translation.
JP Office Action dated Dec. 26, 2023, in application No. JP20220141888 with English translation.
KR Office Action dated Nov. 14, 2023, in KR Application No. 10-2022-7031314 with English Translation.
International Preliminary Report on Patentability dated Oct. 26, 2023, in PCT Application No. PCT/US2022/024295.
International Search Report and Written Opinion dated Oct. 17, 20223 in PCT Application No. PCT/US2023/069018.
SG Office Action dated Oct. 11, 2023, in application No. SG11202201453T.
SG Written Opinion dated Oct. 4, 2023 in Application No. SG11202109796Q.
TW Office Action dated Oct. 19, 2023 in Application No. TW107112210 with English translation.
U.S. Non-Final Office Action dated Nov. 6, 2023, in U.S. Appl. No. 17/814,206.
U.S. Non-Final Office Action dated Oct. 26, 2023, in U.S. Appl. No. 17/589,416.
CN Office Action dated Dec. 28, 2023 in CN Application No. 202080059499.7 with English Translation.
EP Extended European Search report dated Dec. 14, 2023, in Application No. EP20854552.5.
International Preliminary Report on Patentability and Written Opinion dated Nov. 23, 2023 in PCT Application No. PCT/US2022/028845.
KR Office Action dated Dec. 15, 2023 in KR Application No. 10-2023-7028915.
TW Office Action dated Dec. 5, 2023 in TW Application No. 109107661 with English translation.
TW Office Action dated Dec. 21, 2023 in Application No. TW108126326 with English translation.
U.S. Non-Final Office Action dated Jan. 17, 2024 in U.S. Appl. No. 17/814,207.
U.S. Non-Final Office Action dated Nov. 30, 2023 in U.S. Appl. No. 17/250,452.
U.S. Notice of Allowance dated Jan. 2, 2024 in U.S. Appl. No. 17/310,293.
U.S. Appl. No. 18/559,783, inventor Bhadauriya S, filed on Nov. 23, 2023.
CN Office Action dated Jan. 18, 2024 in CN Application No. 202080020646.X with English translation.
Gall D., "Electron Mean Free Path in Elemental Metals," Journal of Applied Physics, Feb. 23, 2016, vol. 119, 6 Pages.
International Preliminary Report on Patentability dated Jul. 20, 2023, in PCT Application No. PCT/US2022/011053.
International Search Report and Written Opinion dated Apr. 25, 2022, for International Application No. PCT/US2022/011053.
International Search Report and Written Opinion dated Feb. 7, 2024 in PCT Application No. PCT/US2023/034858.
International Search Report and Written Opinion dated Jan. 27, 2023 in PCT Application No. PCT/US2022/077818.
International Search Report and Written Opinion report dated Sep. 14, 2022 in Application No. PCT/US2022/072603.

JP Office Action dated Feb. 6, 2024 in JP Application No. 2021-543355 with English translation.
KR Office Action dated Dec. 15, 2023 in KR Application No. 10-2023-7028915, with English Translation.
KR Office Action dated Jan. 27, 2023 in Application No. KR10-2017-0102113 with English Translation.
Pol, V. G., et al., "Fabrication of Magnetic Nanoparticles Using Rapet Technique With or Without Employing External Magnetic Field," The Journal of Physical Chemistry C, 2008, vol. 112, pp. 6627-6637.
Qu Jingxin, et al., "Surface Engineering Handbook," Chemical Industry Publishing House, Mar. 31, 1998, p. 277.
Sun Yicai, et al., "Design Manufacturing and Application," Metallurgical Industry Publishing House, Apr. 30, 2000, p. 166.
U.S. Appl. No. 18/258,973, inventors Na J S, et al., filed on Jun. 22, 2023.
Werndrup P., et al., A Single-source-precursor Approach to Late Transition Metal Molybdate Materials: the Structural Role of Chelating Ligands in the Formation of Heterometallic Heteroleptic Alkoxide Complexes, European Journal of Inorganic Chemistry, 2006, vol. 2006 (7), 1413-1422.
JP Office Action dated Mar. 26, 2024 in JP Application No. 2022-524041 with English translation.
KR Office Action dated Mar. 29, 2024 in KR Application No. 10-2020-7017697 with English translation.
KR Office Action dated May 7, 2024 in KR Application No. 10-2020-7034800, with English Translation.
TW Office Action dated Apr. 24, 2024 in TW Application No. 109130013, With English Translation.
TW Office Action dated May 9, 2024 in TW Application No. 109107661 with English translation.
TW Office Action dated May 22, 2024 in TW Application No. 109135654, with English Translation.
U.S. Final Office Action dated Apr. 12, 2024 in U.S. Appl. No. 17/814,206.
U.S. Final Office Action dated May 8, 2024 in U.S. Appl. No. 17/250,452.
U.S. Final Office Action dated May 9, 2024 in U.S. Appl. No. 17/814,207.
U.S. Non-Final Office Action dated May 23, 2024 in U.S. Appl. No. 17/662,220.
U.S. Notice of Allowance dated Apr. 4, 2024 in U.S. Appl. No. 17/310,293.
U.S. Appl. No. 18/626,278, inventors Collins J, et al., filed on Apr. 4, 2024.
U.S. Appl. No. 18/663,014, inventor Thombare, S filed on May 13, 2024.
U.S. Appl. No. 18/714,506, inventors Mandia D.J., et al., filed on May 29, 2024.
U.S. Restriction requirement dated May 13, 2024, in U.S. Appl. No. 18/310,523.
International Search Report and Written Opinion dated Feb. 16, 2024 in PCT Application No. PCT/US2023/035873.
JP Office Action dated Feb. 20, 2024 in JP Application No. 2023-547183 with English translation.
JP Office Action dated Feb. 27, 2024 in Application No. JP2022-522581 with English Translation.
JP Office Action dated Mar. 5, 2024 in JP Application No. 2022-141887, with English Translation.
JP Office Action dated Mar. 19, 2024 in JP Application No. 2020-561743, with English Translation.
KR Office Action dated Mar. 1, 2024 in KR Application No. 10-2021-7018803, with English Translation.
U.S. Final Office Action dated Feb. 12, 2024 in U.S. Appl. No. 17/589,416.
U.S. Non-Final Office Action dated Feb. 29, 2024 in U.S. Appl. No. 17/294,378.

\* cited by examiner

MOLYBDENUM DEPOSITION

INCORPORATION BY REFERENCE

An Application Data Sheet is filed concurrently with this specification as part of the present application. Each application that the present application claims benefit of or priority to as identified in the concurrently filed Application Data Sheet is incorporated by reference herein in their entireties and for all purposes.

BACKGROUND

Tungsten (W) film deposition using chemical vapor deposition (CVD) techniques is an integral part of semiconductor fabrication processes. For example, tungsten films may be used as low resistivity electrical connections in the form of horizontal interconnects, vias between adjacent metal layers, and contacts between a first metal layer and the devices on a silicon substrate. Tungsten films may also be used in various memory applications, including in formation of buried wordline (bWL) architectures for dynamic random access memory (DRAM), word lines for 3D NAND, and logic applications. However, the continued decrease in feature size and film thickness brings various challenges including high resistivity for thinner films.

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

Provided herein are methods of forming low resistivity bulk conductors. The methods involve forming bulk conductive films on thin low resistivity transition metal layers that have large grain size. The bulk conductive films follow the grains of the low resistivity transition metal films, resulting in large grain size. Also provided are devices including template layers and bulk films.

One aspect of the disclosure may be implemented in a method involving providing a molybdenum (Mo)-containing layer in a feature on a substrate; and depositing a tungsten (W)-containing layer on the Mo-containing layer to thereby fill the feature. In some embodiments, the method further includes annealing the Mo-containing layer prior to depositing the W-containing layer. The Mo-containing layer may be a template for W grain growth. In some embodiments, the Mo-containing layer is elemental Mo having less than 1 (atomic) % impurities. The Mo-containing layer may be relatively thin, for example, between 1 and 10 nm or 1 and 5 nm thick. The W-containing layer may be at least 5, 10, or 20 times thicker than the Mo-containing layer. In some embodiments, the Mo-containing layer overlies a dielectric layer, such as a silicon oxide or aluminum oxide layer. In some embodiments, the Mo-containing layer overlies a barrier layer, such as a titanium nitride layer. In some embodiments, the Mo-containing layer is free of fluorine impurities.

In some embodiments, the average crystallite size of the Mo-containing layer is at least 20 nm. In some embodiments, the average crystallite of the W-containing layer is at least 20 nm.

The method may further involve depositing the Mo-containing layer. In some embodiments, the Mo-containing layer is deposited from one or more molybdenum chloride precursors. Examples include molybdenum pentachloride ($MoCl_5$), molybdenum dichloride dioxide ($MoO_2Cl_2$), and molybdenum tetrachloride oxide ($MoOCl_4$). In some embodiments, the depositing the Mo-containing layer comprises performing an atomic layer deposition process in which a molybdenum chloride precursor is reduced by hydrogen.

In some embodiments, the W-containing layer is deposited using tungsten hexafluoride. The W-containing layer may be deposited without depositing a nucleation layer. In some embodiments, the W-containing layer is deposited by atomic layer deposition (ALD). In some embodiments, the tungsten-containing film is deposited by chemical vapor deposition (CVD).

Another aspect of the disclosure may be implemented in a method including forming a conductive template layer on a substrate, the template layer being between 1 and 5 nm; annealing the conductive template layer to increase grain size with the conductive template layer; and forming a bulk conductive layer on the template layer, wherein the grains in the bulk conductive layer follow that of the conductive template layer. In some embodiments, the conductive template layer is molybdenum. The bulk conductive layer may be selected from the group consisting of one of tungsten, cobalt, ruthenium, nickel, and alloys containing at least one of tungsten, cobalt, ruthenium, nickel. In some embodiments, the conductive template layer is deposited to line a feature and the bulk conductive layer is deposited to fill the feature with bulk conductive material.

Another aspect of the disclosure may be implemented in a method including providing a partially fabricated 3-D NAND structure having multiple oxide layers separated by gaps; and conformally depositing a molybdenum template layer in the gaps, the molybdenum template layer being between about 1 and 10 nm thick. In some embodiments, the molybdenum template layer is deposited directly on an oxide surface. In some embodiments, the molybdenum template layer is between 1 and 5 nm thick. The method may further include filling the gaps with tungsten.

Another aspect of the disclosure may be implemented in a method of filling a 3-D structure of a partially manufactured semiconductor substrate with tungsten, the 3-D structure comprising sidewalls, a plurality of openings in the sidewalls leading to a plurality of features having a plurality of interior regions fluidically accessible through the openings, the method involving depositing a first layer of molybdenum within the 3-D structure such that the first layer conformally lines the plurality of features of the 3-D structure; and depositing tungsten (W) on the Mo-containing layer to thereby fill the feature with tungsten.

Another aspect of the disclosure may be implemented in an apparatus that includes one or more chambers each configured to house a substrate; a support substrate in each of the one or more chambers; gas inlets configured to direct gas into each of the one or more chambers; a heater configured to heat the substrate support in each chamber; and a controller comprising program instructions for inletting a molybdenum precursor into the one or more chambers; and after inletting the molybdenum precursor, inletting a tungsten precursor into the one or more chambers.

Another aspect of the disclosure may be implemented in 3-D NAND structure that includes multiple tungsten wordlines separated by oxide layers; and a molybdenum thin film at the tungsten-oxide interface. In some embodiments, the molybdenum thin film is between 1 and 5 nm thick.

These and other aspects are discussed below with reference to the Figures.

BRIEF DESCRIPTIONS OF DRAWINGS

DETAILED DESCRIPTION

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Figure 1A:
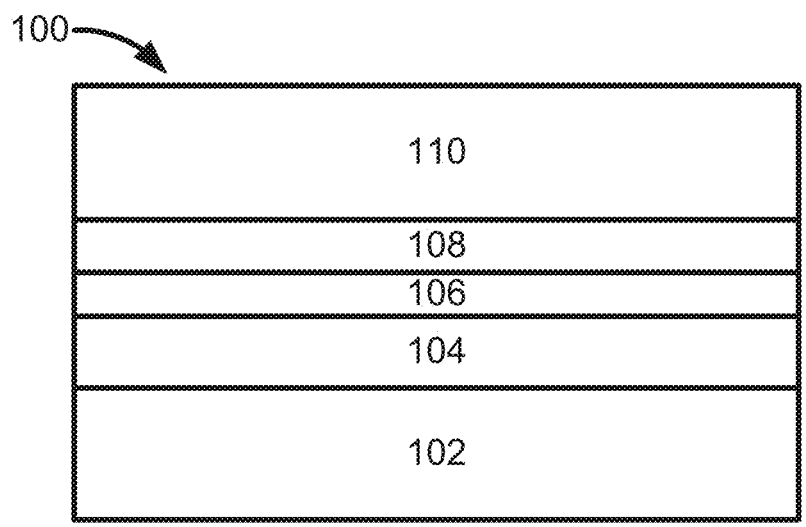
FIGS. 1A and 1B are schematic examples of material stacks that include molybdenum (Mo) templates and tungsten (W) conductors according to various embodiments.
Figure 1B:
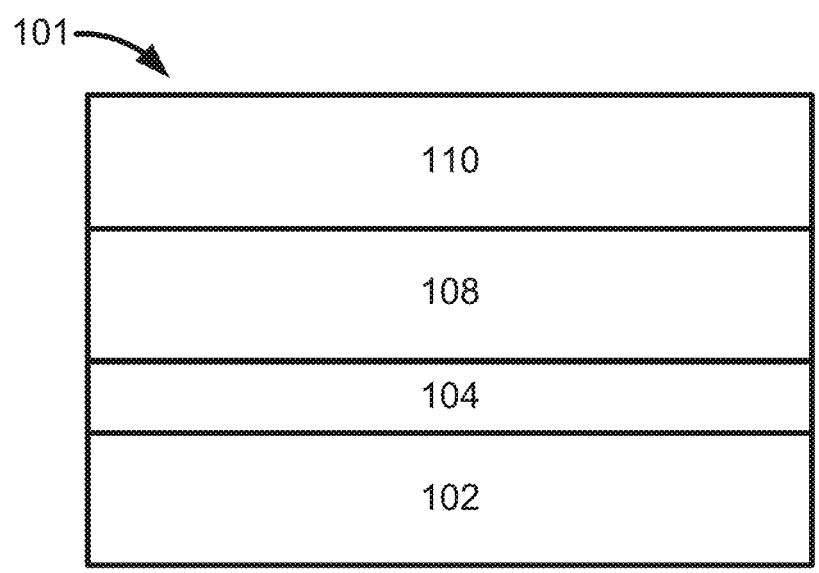

Provided herein are low resistance metallization stack structures for logic and memory applications. FIGS. 1A and 1B are schematic examples of material stacks that include molybdenum (Mo) as a template for tungsten growth. FIGS. 1A and 1B illustrate the order of materials in a particular stack and may be used with any appropriate architecture and application, as described further below with respect to FIGS. 2, 3A, and 3B. In the example of FIG. 1A, a substrate 102 has a Mo layer 108 is deposited thereon. The substrate 102 may be a silicon or other semiconductor wafer, e.g., a 200-mm wafer, a 300-mm wafer, or a 450-mm wafer, including wafers having one or more layers of material, such as dielectric, conducting, or semi-conducting material deposited thereon. The methods may also be applied to form metallization stack structures on other substrates, such as glass, plastic, and the like.

In FIG. 1A, a dielectric layer 104 is on the substrate 102. The dielectric layer 104 may be deposited directly on a semiconductor (e.g., Si) surface of the substrate 102, or there may be any number of intervening layers. Examples of dielectric layers include doped and undoped silicon oxide, silicon nitride, and aluminum oxide layers, with specific examples including doped or undoped layers $SiO_2$ and $Al_2O_3$. Also, in FIG. 1A, a diffusion barrier layer 106 is disposed between the Mo layer 108 and the dielectric layer 104. Examples of diffusion barrier layers including titanium nitride (TiN), titanium/titanium nitride (Ti/TiN), tungsten nitride (WN), and tungsten carbon nitride (WCN). Further examples diffusion barriers are multi-component Mo-containing films as described further below. A tungsten (W) layer 110 is deposited on the Mo layer 108 and is the main conductor of the structure. As discussed further below, the Mo layer 108 provides a template for tungsten growth. As a result, in some embodiments, the W layer 110 is deposited without a tungsten nucleation layer.

FIG. 1B shows another example of a material stack. In this example, the stack includes the substrate 102, dielectric layer 104, with Mo layer 108 deposited directly on the dielectric layer 104, without an intervening diffusion barrier layer. As in the example of FIG. 1A, a W layer 110 is deposited on the Mo layer 108 and is the main conductor of the structure. By using molybdenum, which has large grains, as a template for tungsten growth, tungsten having large grains and low resistivity can be formed. Further, resistivity can be improved by eliminating the higher resistivity tungsten nucleation layer.

While FIGS. 1A and 1B show examples of metallization stacks, the methods and resulting stacks are not so limited. For example, in some embodiments, Mo may be deposited directly on a Si or other semiconductor substrate as a template for tungsten growth.

Further, while W growth on Mo templates is described in the examples above, the Mo layer may serve as a template for low resistivity growth of other metals including molybdenum (Mo), cobalt (Co), ruthenium (Ru), nickel (Ni), and alloys including these metals such as MoW.

Figure 2:
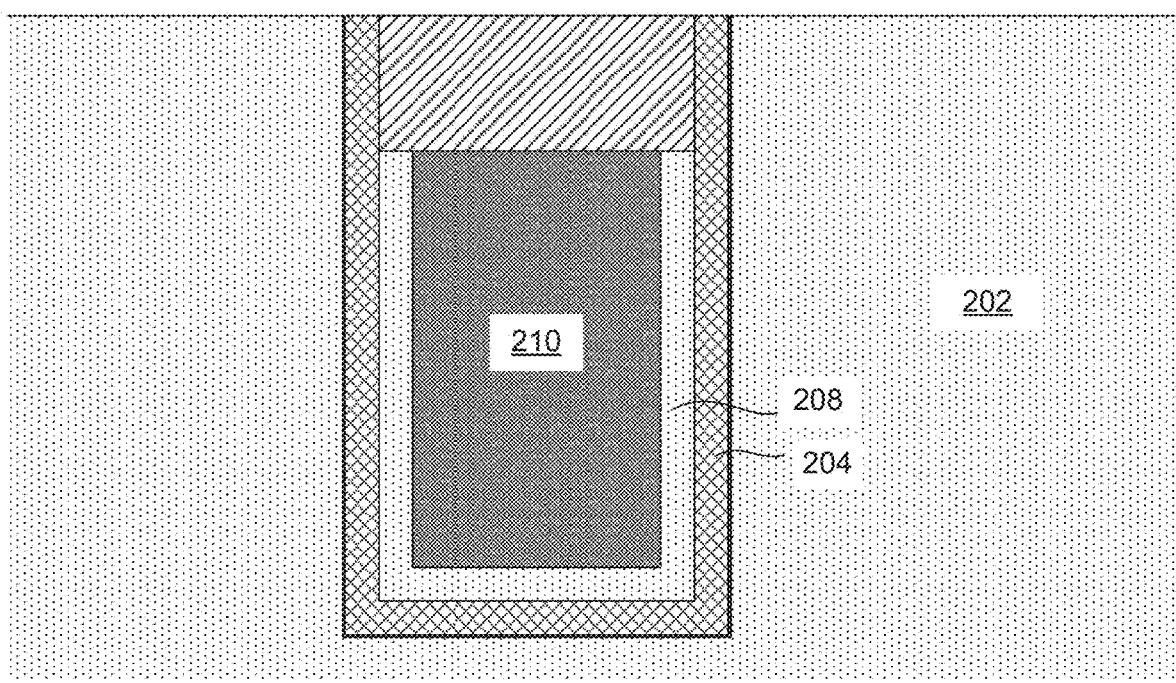
FIG. 2 depicts a schematic example of a DRAM architecture including a W buried wordline (bWL) on a Mo template.
Figure 3A:
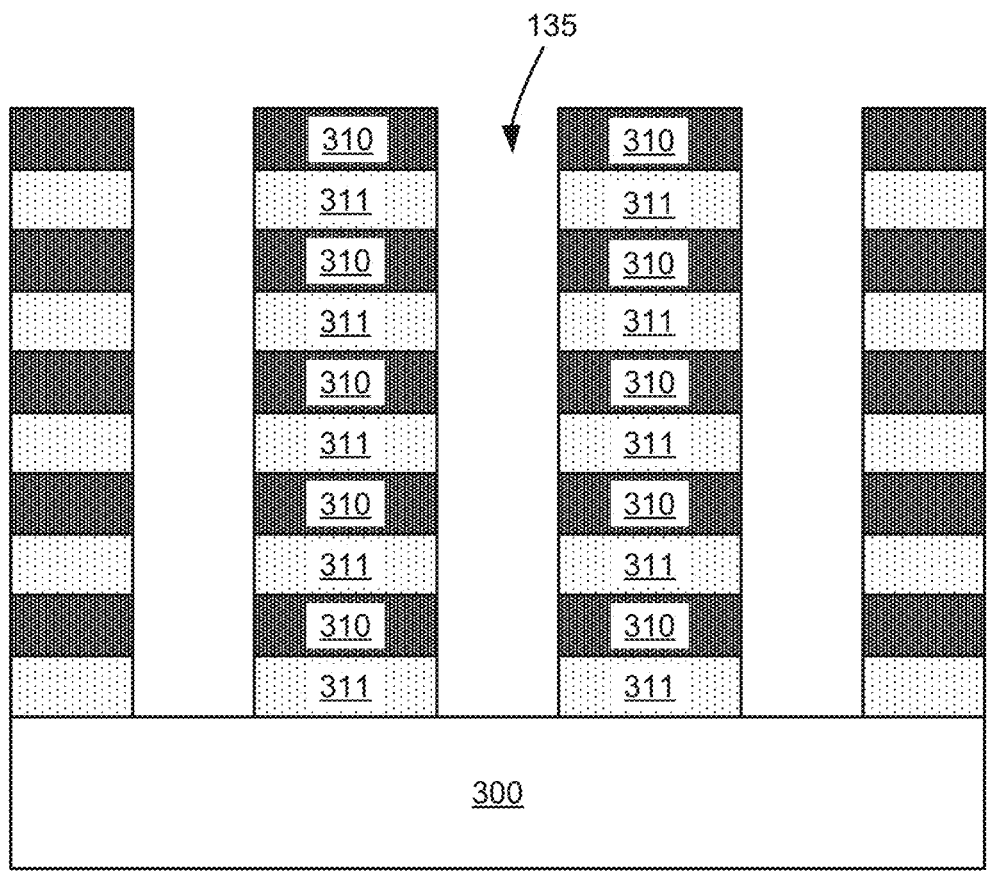
FIG. 3A depicts a schematic example of a W wordline in a 3D NAND structure.
Figure 3B:
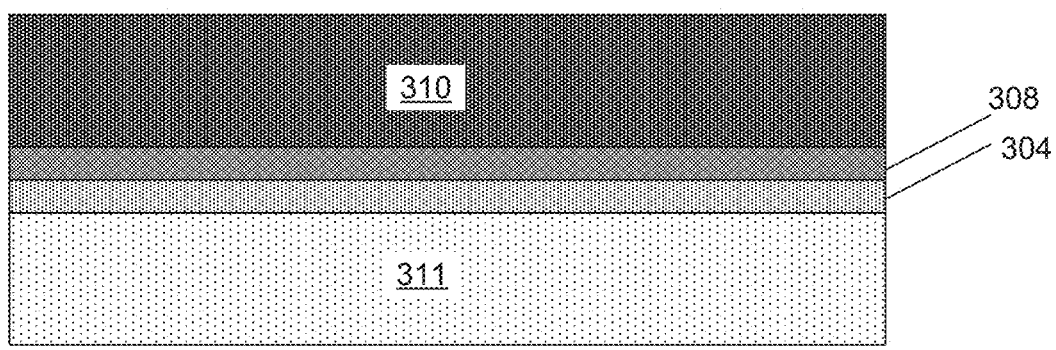
FIG. 3B depicts a material stack of a W wordline including a Mo template layer.

The material stacks described above and further below may be employed in a variety of embodiments. FIGS. 2, 3A, and 3B provide examples of structures in which the stacks may be employed. FIG. 2 depicts a schematic example of a DRAM architecture including a W buried wordline (bWL) 210 in a silicon substrate 202. The W bWL 210 is formed in a trench etched in the silicon substrate 202. Lining the trench is a conformal Mo layer 208 and an insulating layer 204 that is disposed between the conformal barrier layer 206 and the silicon substrate 202. In the example of FIG. 2, the insulating layer 204 may be a gate oxide layer, formed from a high-k dielectric material such as a silicon oxide or silicon nitride material. In some embodiments, a conformal barrier layer such as TiN or a tungsten-containing layer may be interposed between the Mo layer 208 and the insulating layer 204.

FIG. 3A depicts a schematic example W wordlines 310 in a 3D NAND structure 323. The W wordlines 310 are separated by oxide layers 311. In FIG. 3B, a detail of the interface between a W wordline 310 and oxide layer 311 is shown including a layer of aluminum oxide ($Al_2O_3$) 304 and a Mo layer 308 is shown. As described above, the W wordlines 310 may be deposited on the Mo layers 308 without a tungsten nucleation layer. In some embodiments, the Mo layer 308 may be deposited directly on the oxide layer 311 or on a TiN or other barrier layer as described herein. The Mo layers may be between about 10 Å and 100 Å, or 10 Å and 50 Å, for example, for deposition of a W wordline layer of between about 10 nm and 100 nm.

Figure 4:
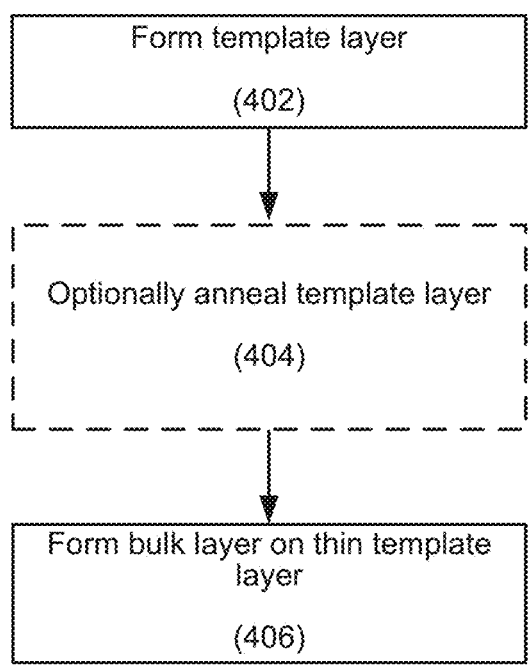
FIG. 4 is a process flow diagram illustrating operations in a method of depositing a conductive material.

FIG. 4 is a process flow diagram illustrating operations in a method of depositing a conductive material. In operation 402, a template layer is formed. As described further below, this can involve vapor deposition techniques such as chemical vapor deposition (CVD) and atomic layer deposition (ALD) deposition. The template layer is a material that has relatively large grain growth such as molybdenum. The layer may be relatively thin, no more than 10 nm or no more than 50 nm in some embodiments. Generally, the layer is thick enough for continuous growth on the underlying structure. Example thicknesses range from 1 nm-5 nm, or 2 nm to 5 nm. The template layer may conform to the underlying structure as in the examples of FIGS. 2 and 3B. For challenging structures, such as 3D NAND structures, ALD may be used to form a conformal layer. Example surfaces on which the template layer may be formed include dielectric and barrier layer surfaces. In certain embodiments, the template layer may be deposited from a non-fluorine-containing precursor. This can prevent fluorine from migrating to the underlying structure.

In some embodiments, the template layer is annealed in an operation 402. Thermal anneal of a layer can increase grain size and lower resistivity. Examples of anneal temperatures for molybdenum range from 700° C. to 1100° C. In general, the anneal is performed at temperatures at or near the melting temperature. The anneal may be performed in a furnace or by rapid thermal annealing. According to various embodiments, it may be performed in any appropriate ambient, including a hydrogen ($H_2$) ambient, a nitrogen ($N_2$) ambient, or vacuum. In some embodiments, the film may be exposed to a reducing environment prior to anneal to remove any oxide formation. Oxides may form in particular if the template is exposed to air prior to anneal. At operation 406, a bulk layer is formed on the template layer. Grain size is larger as a result of being deposited on the template. The bulk layer is generally the main conductor of the structure. By depositing it on a template, less expensive and/or readily available precursors such as tungsten hexafluoride ($WF_6$) or molybdenum hexafluoride ($MoF_6$) may be used. ALD or CVD methods may be used, depending on the structure. In one example, $WF_6$ and $H_2$ are used to deposit tungsten. Deposition of other bulk films is described further below.

Methods of forming Mo template layers include vapor deposition techniques such as (CVD and ALD deposition. In an ALD technique, pulses of a reducing agent (or other co-reactant), optional purge gases, and Mo-containing precursor are sequentially injected into and purged from the reaction chamber. Deposition of the Mo layer can alternatively occur by a CVD process in which a reducing agent and a Mo-containing precursor are flowed into a deposition chamber to deposit a Mo layer in the feature. An inert carrier gas may be used to deliver one or more of the reactant streams, which may or may not be pre-mixed. Unlike ALD processes, this operation generally involves flowing the reactants continuously until the desired amount is deposited. In certain implementations, the CVD operation may take place in multiple stages, with multiple periods of continuous and simultaneous flow of reactants separated by periods of one or more reactant flows diverted.

Mo-containing precursors include molybdenum hexafluoride ($MoF_6$), molybdenum pentachloride ($MoCl_5$), molybdenum dichloride dioxide ($MoO_2Cl_2$), molybdenum tetrachloride oxide ($MoOCl_4$), and molybdenum hexacarbonyl ($Mo(CO)_6$). Organometallic precursors such as molybdenum silylcyclopentadienyl and molybdenum silylallyl complexes may be used. Mo-containing precursors may be halide precursors, which include $MoF_6$ and $MoCl_5$ as well as mixed halide precursors that have two or more halogens that can form a stable molecule. An example of a mixed halide precursor is $MoCl_xBr_y$, with x and y being any number greater than 0 that can form a stable molecule In certain embodiments, a Mo layer is deposited directly on a dielectric layer or on a TiN or other barrier layer. In an ALD process, pulses of a co-reactant, optional purge gases, and Mo-containing precursor are sequentially injected into and purged from the reaction chamber. In some embodiments, a thin Mo layer deposited using one or more of a boron-containing reducing agent (e.g., $B_2H_6$), a silicon-containing reducing agent (e.g., $SiH_4$), or hydrogen ($H_2$) as a co-reactant. For example, one or more S/Mo cycles, where S/Mo refers to a pulse of silane followed by a pulse of a Mo-containing precursor, may be employed to deposit a thin Mo layer that will serve as a template for tungsten deposition. In another example, one or more B/Mo cycles, where B/Mo refers to a pulse of diborane followed by a pulse of a Mo-containing precursor, may be employed to deposit a thin Mo layer on which a tungsten layer is to be deposited. B/Mo and S/Mo cycles may both be used to deposit a Mo layer, e.g., x(B/Mo)+y(S/Mo), with x and y being integers. Still further one or more $H_2$/Mo cycles may be used to deposit a thin Mo layer, with or without B/Mo and/or S/Mo cycles.

Depending on the thickness of the Mo layer and the structure on which it is to be deposited, depositing the Mo layer can involve deposition of a Mo nucleation layer followed by deposition by a bulk layer. In some embodiments, this can involve ALD deposition of the nucleation layer followed by CVD deposition of the bulk layer.

In some embodiments, deposition of the Mo template layer can involve forming a reducing agent layer followed by exposure of the reducing agent layer to a Mo-containing precursor. A reducing agent layer may include or consist essentially of elemental silicon (Si), elemental boron (B), elemental germanium (Ge), or mixtures thereof. For example, a reducing agent layer may include Si and B. The amount of B may be tailored to achieve high deposition rate of the reducing agent layer but with low resistivity.

Substrate temperature during Mo deposition may be between 300° C. to 800° C. Substrate temperature will depend on the thermal budget and the deposition chemistry. Thermal budget depends on the applications, while high deposition temperature may not be an issue for memory applications, it can exceed the thermal budget for logic applications.

Figure 5:
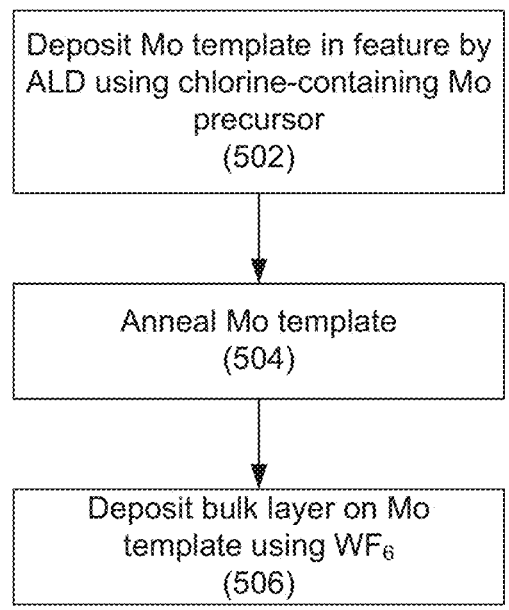
FIG. 5 is a process flow diagram illustrating operations in a method of filling a feature with tungsten.

FIG. 5 shows an example of a process for feature fill. The process in FIG. 5 may be used for tungsten wordline fill, for example. In an operation 502, a Mo template is deposited by ALD using a chlorine-containing Mo precursor. The ALD process may be used to achieve conformality and step coverage over challenging 3D NAND structures. The ALD cycles may be used to deposit a Mo layer between about 10 Å and 50 Å, for example, on a dielectric or barrier layer surface. In some embodiments, the ALD cycles use $H_2$ as the reducing agent, without having boron or silicon incorporated into the film. Further, the ALD cycle use chloride-containing precursors. This prevents the underlying dielectric layer from being exposed to fluorine. For chlorine containing Mo precursors, relatively high deposition temperature may be used, e.g. 450° C.-800° C., and in some embodiments, at least 500°, or between 550° C. and 650° C. Because the Mo—Cl bond in these precursors is relatively strong, high temperatures facilitate deposition.

Then, in an operation 504, the Mo template is annealed. As described above, the annealing may be preceded by a reducing step to remove any oxide. This can remove molybdenum dioxide ($MoO_2$) or molybdenum trioxide ($MoO_3$) that has formed as a result of air or other oxidant exposure. $MoO_3$ in particular has a melting point of 795° C. and could melt during anneal if not removed. A bulk layer is then deposited on the Mo template to form the wordline or other conductor in an operation 506. The tungsten fill can involve a fluorinated precursor such as $WF_6$, with the Mo layer providing a barrier against fluorine migration to the dielectric. For 3D NAND structures, operation 506 may involve alternating pulses of $WF_6$ and $H_2$ in an ALD deposition. The deposition may be performed without forming a tungsten nucleation layer in some embodiments. Example thicknesses for tungsten range between 50 Å and 300 Å. The ratio of W:Mo thickness may be 1:1-15:1 according to some embodiments, e.g., 2:1-10:1, or 2:1-5:1.

As described above, the method discussed with reference to FIG. 4 may be used to deposit other low resistivity bulk films on templates. Such films can include cobalt (Co), ruthenium (Ru), and nickel (Ni). Examples of cobalt precursors dicarbonyl cyclopentadienyl cobalt, cobalt carbonyl, a cobalt amidinate precursor, a cobalt diazadienyl complex, and a cobalt amidinate/guanidinate precursor. Examples of ruthenium precursors that may be used for oxidative reac- 1100° C. The anneal may be performed in a furnace or by rapid thermal annealing. According to various embodiments, it may be performed in any appropriate ambient, including a hydrogen ($H_2$) ambient, a nitrogen ($N_2$) ambient, or vacuum.

According to various embodiments, the Mo film may or may not be exposed to air between deposition and annealing. If it is exposed to air or other oxidizing environment, a reducing environment may be employed during or before anneal to remove molybdenum dioxide ($MoO_2$) or molybdenum trioxide ($MoO_3$) that has formed as a result of the exposure. $MoO_3$ in particular has a melting point of 795° C. and could melt during anneal if not removed.

Table 1, below, compares two W films (A and B) and two Mo films (C and D)

|  | A | B | C | D |
|---|---|---|---|---|
| Resistivity | 20 μΩ-cm at 20 nm | 28 μΩ-cm at 20 nm 40 μΩ-cm at 10 nm | 25 μΩ-cm at 10 nm | 17 μΩ-cm at 10 nm (after 800 C. anneal) |
| Composition | <3E18 at/cm³ F. | <5E18 at/cm³ Cl, F. below detection limit | 95% Mo + 5% H, <1E19 at/cm³ Cl | <1% O, <1E19 at/cm³ Cl |
| Stress | <0.55 Gpa @ 20 nm | <0.2 Gpa @ 20 nm | 0.4 GPa @ 70 nm | 0.6 GPa @ 30 nm | tions include (ethylbenzyl)(1-ethyl-1,4-cyclohexadienyl)Ru (0), (1-isopropyl-4-methylbenzyl)(1,3-cyclohexadienyl)Ru (0), 2,3-dimethyl-1,3-butadienyl)Ru(0)tricarbonyl, (1,3-cyclohexadienyl)Ru(0)tricarbonyl, and (cyclopentadienyl)(ethyl)Ru(II)dicarbonyl.. Examples of ruthenium precursors that react with non-oxidizing reactants are bis(5-methyl-2, 4-hexanediketonato)Ru(II)dicarbonyl and bis(ethylcyclopentadienyl)Ru(II). Examples of nickel precursors include cyclopentadienylallylnickel (CpAllylNi) and $MeCp_2Ni$.

In the description above, ALD may be used to deposit the bulk tungsten or other bulk material. In particular, ALD may be used to deposit tungsten or other metal that has lateral grain growth. In this manner, the deposited metal has much larger grain growth, including larger lateral grain growth, than can be obtained with techniques such as CVD or sputtering. In some embodiments, grains of at least 100 Å wide are grown. Example W ALD deposition conditions that can provide lateral grain growth include 300° C. to 500° C. substrate temperature, or less than 500° C. and 10 torr to 50 torr chamber pressure.

Examples of applications include 3D NAND word line fill and DRAM bWL fill. In these applications, a single template layer of molybdenum (or other template layer) may be used with the remainder of the feature filled with tungsten (or other main conductor). The Mo other template layer may be deposited on layers such as titanium nitride (TiN) or oxides such as silicon oxide (e.g., $SiO_2$), aluminum oxide (e.g., $Al_2O_3$), hafnium oxide (e.g., $HfO_2$), and zirconium oxide (e.g., $ZrO_2$).

Experimental

Figure 6:
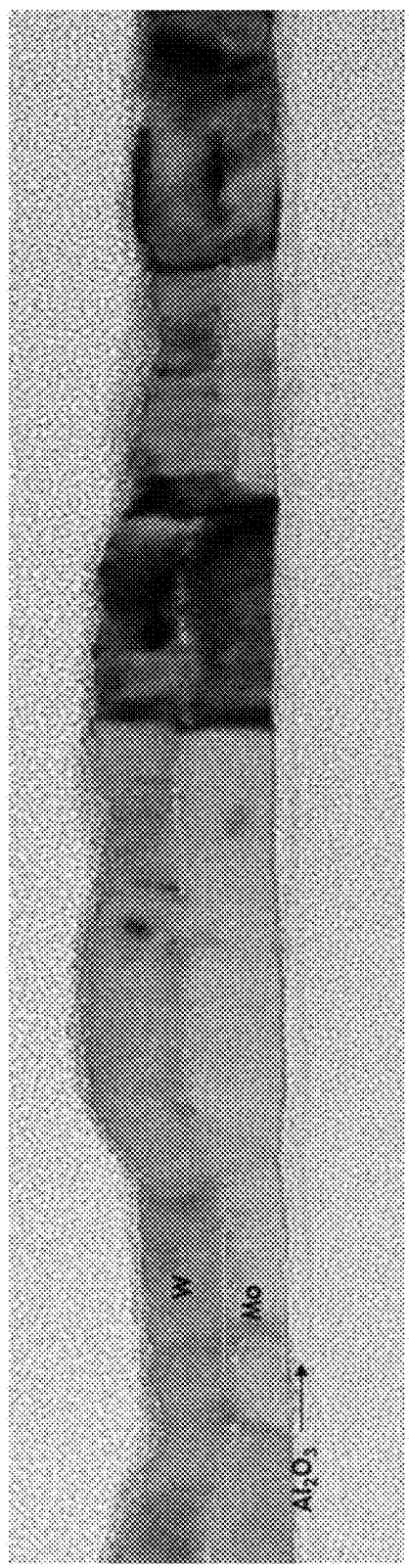
FIG. 6 shows an image of a tungsten film deposited on a molybdenum template.

A molybdenum film was grown directly on $Al_2O_3$, followed by an anneal, and tungsten deposition. FIG. 6 shows an image of the W film on the Mo film. The image shows that the W grains are templating off the Mo grains below.

In some embodiments, a thermal anneal is performed after Mo deposition. This can allow Mo grain growth and lower resistivity. Because the melting point of Mo is lower than that of W, grain growth and the accompanying decrease in resistivity occur at lower temperatures for Mo films. Examples of anneal temperatures range from 700° C. to Film A is a tungsten film deposited using $WF_6$. Film B is a tungsten film deposited using $WCl_5$ and $WCl_6$. Film C is a molybdenum film deposited using $MoCl_5$ and film D is a molybdenum film deposited using $MoOCl_4$. Film D was subject to a post-deposition anneal. Notably, the resistivity is lower for Films C and D than films A and B. Resistivity decreases with thickness, with the 25 μΩ-cm (film C) and 17 μΩ-cm (film D) directly comparable to the 40 μΩ-cm (film A). Film D, deposited with an O-containing precursor, shows low O. The stress of films C and D is comparable to that of films A and B.

Figure 7:
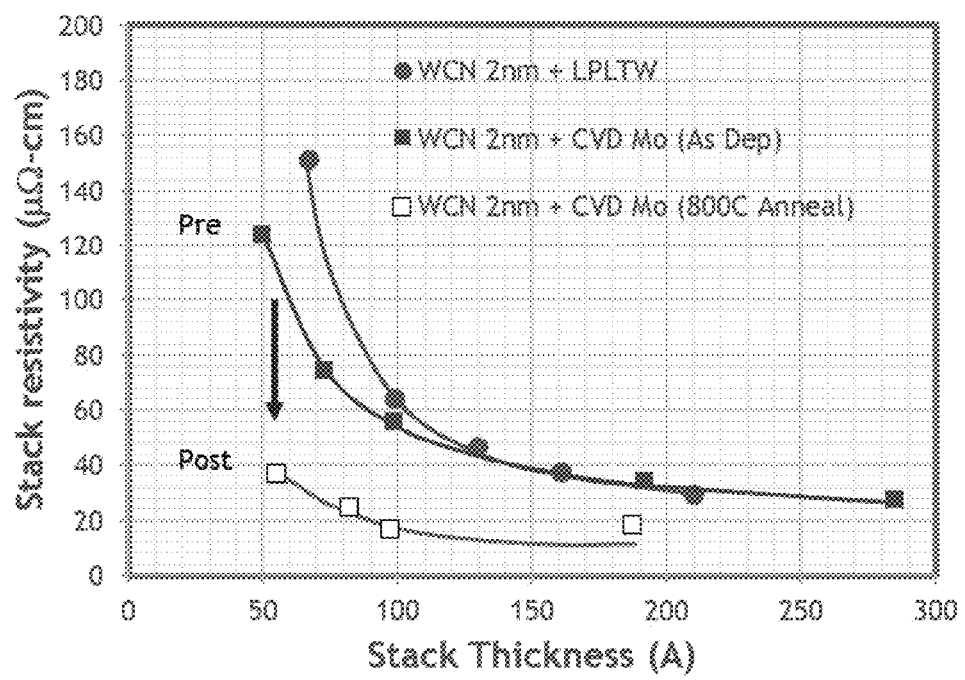
FIG. 7 is a graph showing the reduction in resistivity for Mo films of various thicknesses after anneal at 800° C.

FIG. 7 is a graph showing the reduction in resistivity for Mo films of various thicknesses deposited on WCN after anneal at 800° C. Resistivity of a W film on WCN is also shown for comparison. A significant decrease in resistivity is observed. The decrease in resistivity is due to grain growth. Table 2, below, shows phases and average grain size for Mo grains in as deposited and post-anneal CVD Mo films.

| Sample | Phase | Average Crystallite Size (nm) |
|---|---|---|
| CVD Mo/WCN as deposited | Mo-Molybdenum Cubic | 14.5 |
| CVD Mo/WCN post-anneal | Mo-Molybdenum Cubic | 33.5 |

Furnace anneals of 1 hour and 5 mins at 800° C. in $H_2$ ambient showed comparable results.

Apparatus

Any suitable chamber may be used to implement the disclosed embodiments. Example deposition apparatuses include various systems, e.g., ALTUS® and ALTUS® Max, available from Lam Research Corp., of Fremont, Calif., or any of a variety of other commercially available processing systems. The process can be performed on multiple deposition stations in parallel.

In some embodiments, a molybdenum template deposition process is performed at a first station that is one of two, five, or even more deposition stations positioned within a single deposition chamber. In some embodiments, various steps for the process are performed at two different stations of a deposition chamber. For example, the substrate may be exposed to $H_2$ in a first station using an individual gas supply system that creates a localized atmosphere at the substrate surface, and then the substrate may be transferred to a second station to be exposed to a precursor such as $MoOCl_5$ to deposit the template layer. In some embodiments, the substrate may then be transferred back to the first station for a second exposure of hydrogen. Then the substrate may be transferred to the second station for exposure to $MoOCl_5$ (or other tungsten chloride). This may be repeated as necessary to complete Mo template deposition and proceed with tungsten deposition in the same or different station. One or more stations can then be used to perform tungsten deposition as described above.

Figure 8:
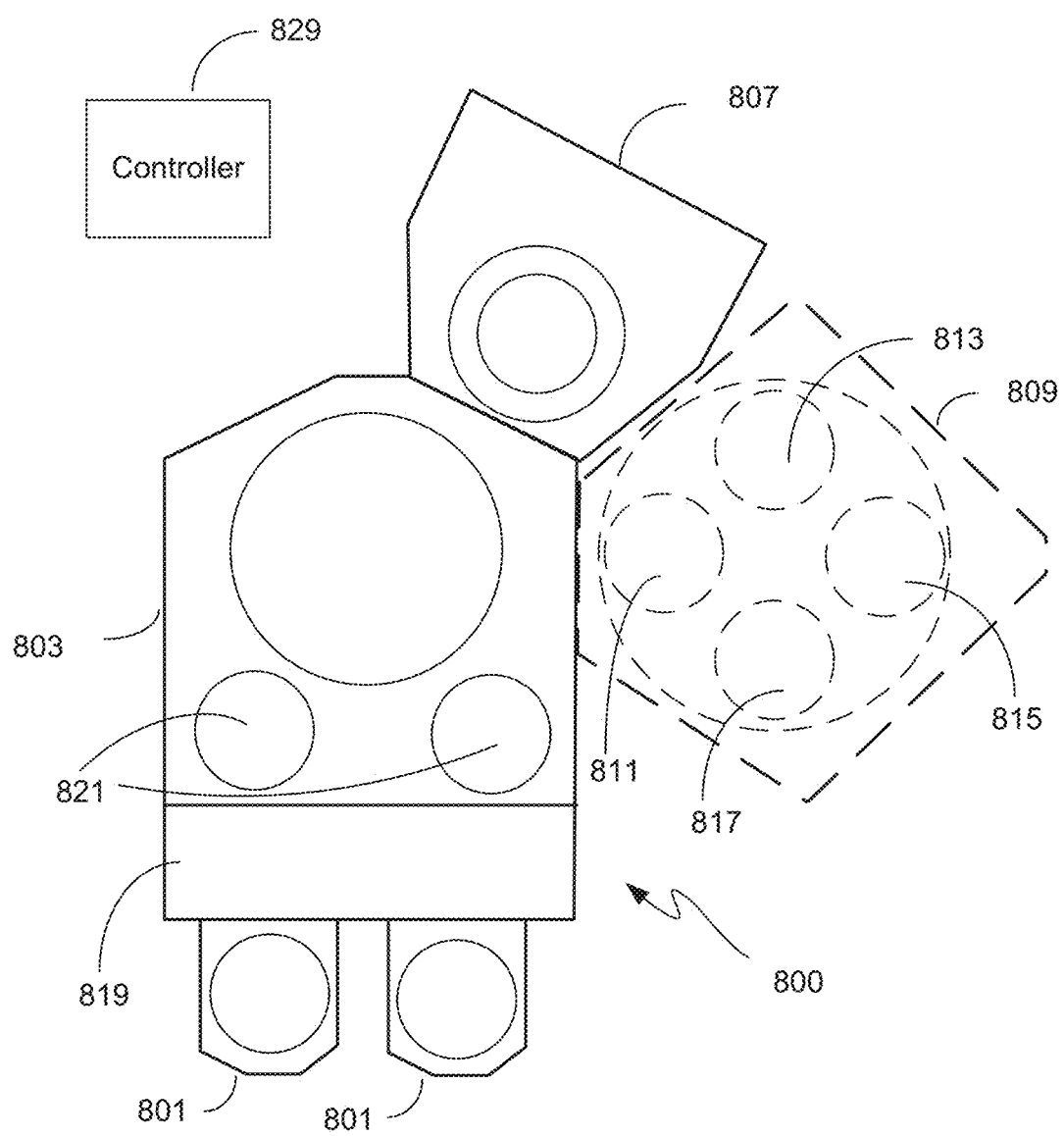
FIG. 8 is a block diagram of a processing system suitable for conducting deposition processes in accordance with embodiments described herein.

FIG. 8 is a block diagram of a processing system suitable for conducting deposition processes in accordance with embodiments described herein. The system 800 includes a transfer module 803. The transfer module 803 provides a clean, pressurized environment to minimize the risk of contamination of substrates being processed as they are moved between the various reactor modules. Mounted on the transfer module 803 is a multi-station reactor 809 capable of performing nucleation layer deposition, which may be referred to as pulsed nucleation layer (PNL) deposition, as well as ALD and CVD deposition according to embodiments described herein. Chamber 809 may include multiple stations 811, 813, 815, and 817 that may sequentially perform these operations. For example, chamber 809 could be configured such that stations 811 and 813 perform PNL or ALD deposition, and stations 813 and 815 perform CVD. Each deposition station may include a heated wafer pedestal and a showerhead, dispersion plate or other gas inlet.

Also mounted on the transfer module 803 may be one or more single or multi-station modules 807 capable of performing plasma or chemical (non-plasma) pre-cleans. The module may also be used for various other treatments, e.g., reducing agent soaking. The system 800 also includes one or more (in this case two) wafer source modules 801 where wafers are stored before and after processing. An atmospheric robot (not shown) in the atmospheric transfer chamber 819 first removes wafers from the source modules 801 to loadlocks 821. A wafer transfer device (generally a robot arm unit) in the transfer module 1103 moves the wafers from loadlocks 821 to and among the modules mounted on the transfer module 803.

In certain embodiments, a system controller 829 is employed to control process conditions during deposition. The controller will typically include one or more memory devices and one or more processors. The processor may include a CPU or computer, analog and/or digital input/output connections, stepper motor controller boards, etc.

The controller may control all of the activities of the deposition apparatus. The system controller executes system control software including sets of instructions for controlling the timing, mixture of gases, chamber pressure, chamber temperature, wafer temperature, radio frequency (RF) power levels if used, wafer chuck or pedestal position, and other parameters of a particular process. Other computer programs stored on memory devices associated with the controller may be employed in some embodiments.

Typically there will be a user interface associated with the controller. The user interface may include a display screen, graphical software displays of the apparatus and/or process conditions, and user input devices such as pointing devices, keyboards, touch screens, microphones, etc.

System control logic may be configured in any suitable way. In general, the logic can be designed or configured in hardware and/or software. The instructions for controlling the drive circuitry may be hard coded or provided as software. The instructions may be provided by "programming." Such programming is understood to include logic of any form, including hard coded logic in digital signal processors, application-specific integrated circuits, and other devices which have specific algorithms implemented as hardware. Programming is also understood to include software or firmware instructions that may be executed on a general purpose processor. System control software may be coded in any suitable computer readable programming language. Alternatively, the control logic may be hard coded in the controller. Applications Specific Integrated Circuits, Programmable Logic Devices (e.g., field-programmable gate arrays, or FPGAs) and the like may be used for these purposes. In the following discussion, wherever "software" or "code" is used, functionally comparable hard coded logic may be used in its place.

The computer program code for controlling the deposition and other processes in a process sequence can be written in any conventional computer readable programming language: for example, assembly language, C, C++, Pascal, Fortran or others. Compiled object code or script is executed by the processor to perform the tasks identified in the program.

The controller parameters relate to process conditions such as, for example, process gas composition and flow rates, temperature, pressure, cooling gas pressure, and chamber wall temperature. These parameters are provided to the user in the form of a recipe, and may be entered utilizing the user interface.

Signals for monitoring the process may be provided by analog and/or digital input connections of the system controller. The signals for controlling the process are output on the analog and digital output connections of the deposition apparatus.

The system software may be designed or configured in many different ways. For example, various chamber component subroutines or control objects may be written to control operation of the chamber components necessary to carry out the deposition processes described herein. Examples of programs or sections of programs for this purpose include substrate positioning code, process gas control code, pressure control code, heater control code, and plasma control code.

In some implementations, a controller 829 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller 829, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings in some systems, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller 829, in some implementations, may be a part of or coupled to a computer that is integrated with, coupled to the system, otherwise networked to the system, or a combination thereof. For example, the controller 829 may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a CVD chamber or module, an ALD chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

The controller 829 may include various programs. A substrate positioning program may include program code for controlling chamber components that are used to load the substrate onto a pedestal or chuck and to control the spacing between the substrate and other parts of the chamber such as a gas inlet and/or target. A process gas control program may include code for controlling gas composition and flow rates and optionally for flowing gas into the chamber prior to deposition in order to stabilize the pressure in the chamber. A pressure control program may include code for controlling the pressure in the chamber by regulating, e.g., a throttle valve in the exhaust system of the chamber. A heater control program may include code for controlling the current to a heating unit that is used to heat the substrate. Alternatively, the heater control program may control delivery of a heat transfer gas such as helium to the wafer chuck.

Examples of chamber sensors that may be monitored during deposition include mass flow controllers, pressure sensors such as manometers, and thermocouples located in pedestal or chuck. Appropriately programmed feedback and control algorithms may be used with data from these sensors to maintain desired process conditions.

The foregoing describes implementation of embodiments of the disclosure in a single or multi-chamber semiconductor processing tool.

The foregoing describes implementation of disclosed embodiments in a single or multi-chamber semiconductor processing tool. The apparatus and process described herein may be used in conjunction with lithographic patterning tools or processes, for example, for the fabrication or manufacture of semiconductor devices, displays, LEDs, photovoltaic panels, and the like. Typically, though not necessarily, such tools/processes will be used or conducted together in a common fabrication facility. Lithographic patterning of a film typically comprises some or all of the following steps, each step provided with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

In the description above and in the claims, numerical ranges are inclusive of the end points of the range. For example, "a thickness between 1 and 5 nm" includes 1 nm and 5 nm. Similarly, ranges represented by a dash are inclusive of the end points of the ranges.

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

The invention claimed is:

1. A method comprising:
   forming a first molybdenum (Mo) layer by exposing a substrate in a reaction chamber to a molybdenum oxychloride and boron-containing reducing; and
   forming a bulk conductive layer on the first Mo layer using hydrogen ($H_2$) as a reducing agent wherein the bulk conductive layer is formed by ALD.

2. The method of claim 1, wherein the bulk conductive layer is a molybdenum (Mo) layer.

3. The method of claim 1, wherein forming the first Mo layer further comprises exposing the substrate to $H_2$.

4. The method of claim 1, wherein the substrate temperature during formation of the first Mo layer is between 300° C. and 800° C.

5. The method of claim 1, wherein the molybdenum oxychloride is molybdenum dichloride dioxide ($MoO_2Cl_2$).

6. The method of claim 1, wherein the first Mo layer is formed by atomic layer deposition (ALD).

7. The method of claim 1, wherein the bulk conductive layer is tungsten.

8. The method of claim 1, wherein the first Mo layer has less than 1 (atomic) % impurities.

9. The method of claim 1, wherein the first Mo layer is between 1 and 10 nm thick.

10. The method of claim 1, wherein the first Mo layer overlies a dielectric layer.

11. The method of claim 1, wherein the first Mo layer is free of fluorine impurities.

* * * * *